United States Patent
Gupta et al.

(10) Patent No.: US 8,737,144 B2
(45) Date of Patent: May 27, 2014

(54) MEMORY ARCHITECTURE AND DESIGN METHODOLOGY WITH ADAPTIVE READ

(75) Inventors: Navneet Gupta, Ghaziabad (IN); Prashant Dubey, Greater Noida (IN); ShaileshKumar Pathak, Greater Noida (IN); Kaushik Saha, Delhi (IN); Ashish Kumar, Jharkhand (IN); R Sai Krishna, Hyderabad (IN)

(73) Assignee: STMicroelectronics International N.V., Amsterdam (NL)

( * ) Notice: Subject to any disclaimer, the term of this patent is extended or adjusted under 35 U.S.C. 154(b) by 196 days.

(21) Appl. No.: 13/340,670

(22) Filed: Dec. 29, 2011

(65) Prior Publication Data

US 2013/0170306 A1 Jul. 4, 2013

(51) Int. Cl.
*G11C 7/00* (2006.01)

(52) U.S. Cl.
USPC ................ 365/189.15; 365/189.07; 365/207

(58) Field of Classification Search
USPC ............... 365/189.15, 189.07, 191, 193, 194, 365/196, 201, 205, 207, 230.06
See application file for complete search history.

(56) References Cited

U.S. PATENT DOCUMENTS

| | | | | | |
|---|---|---|---|---|---|
| 3,967,252 | A | * | 6/1976 | Donnelly | 365/189.09 |
| 4,062,000 | A | * | 12/1977 | Donnelly | 365/203 |
| 5,883,851 | A | * | 3/1999 | Lee | 365/230.03 |
| 5,991,210 | A | * | 11/1999 | Nakaoka | 365/190 |
| 6,721,193 | B2 | * | 4/2004 | Barnes | 365/49.17 |
| 6,834,017 | B2 | * | 12/2004 | Perner et al. | 365/209 |
| 6,898,134 | B2 | * | 5/2005 | Smith et al. | 365/201 |

* cited by examiner

*Primary Examiner* — Gene Auduong
(74) *Attorney, Agent, or Firm* — Graybeal Jackson LLP

(57) ABSTRACT

An embodiment of a sense amplifier includes a sense circuit and a monitor circuit. The sense circuit is configured to convert a first signal that corresponds to data stored in a memory cell into a second signal that corresponds to the data, and the monitor circuit is configured to indicate a reliability of the second signal. The monitor circuit allows, for example, adjusting a parameter of a memory in which the memory cell is disposed to increase the read accuracy, and may also allow recognizing and correcting an error due to an invalid second signal.

53 Claims, 5 Drawing Sheets

MEMORY ARCHITECTURE AND DESIGN METHODOLOGY WITH ADAPTIVE READ

TECHNICAL FIELD

Embodiments relate to memory operation. And particularly, but not exclusively, embodiments may relate to monitoring the operation of a memory.

BACKGROUND

In memories, operations such as read and/or write take place in response to an enable signal, for example, a write enable signal. The write enable signal may be driven by a system clock, with an operation taking place at an operable clock edge of the system clock. Memories may require timing for further operations associated with the read and/or write operations. For example, timing for control operations of the memory, such as a bit line precharge, a word line assertion, and/or a sense amplifier enable, etc.

Self-timed memories may provide these control timings independently of the system clock. These self-time memories may include additional circuitry for the generation of self-time control signals. However, operating conditions of a memory may affect the timing required for the memory. For example, memory components may require more time to operate correctly under low power conditions. Additionally, different requirements for the memory performance, for example, a high speed or low power performance, may affect the timing of the self-timed operations.

Some memories may have built-in-self-test BIST capabilities in order to test the functioning of the memory. Other memories may have a test mode of operation in order to test the functionality of the memories. The testing of the memory may involve the external monitoring of data written to and read from the memory, and typical may take a number of clock cycles to identify an error.

SUMMARY

According to an embodiment, there is provided a memory block including: at least one memory cell; a sense amplifier configured to carry out a sensing operation on the at least one memory cell and determine whether the sensing operation is valid.

The sense amplifier may be further configured to provide an indication of whether the sensing operation is valid. An indication of whether a sensing operation is valid may be provided to error correction circuitry. The sensing operation may include sensing a value stored in the at least one memory cell. The at least one memory cell may be part of a column of memory cells.

The memory block may further include: at least one further column of memory cells; and at least one further sense amplifier associated with a respective at least one further column of memory cells. The at least one further sense amplifier may be configured to carry out a sensing operation on a memory cell of the associated at least one further column of memory cells and determine whether the sensing operation is valid. The at least one further sense amplifier may be configured to provide an indication of whether the sensing operation is valid.

The memory block may further include: a combination circuit configured to receive the indications from the sense amplifier and the at least one further sense amplifier and determine whether at least one of the respective sensing operations is not valid.

The combination circuit may be configured to provide an invalid signal to error correction circuitry in response to the indications from the sense amplifier and the at least one further sense amplifier.

The memory block may further include error correction circuitry configured to determine a parameter of the memory block in response to an indication that a sensing operation is not valid. The parameter may be at least one of a sense amplifier enable signal delay, a sense amplifier current, a memory block voltage, and clock frequency.

The memory block may further include error correction circuitry configured to replace one of: the at least one memory cell; the sense amplifier; and a data path in the memory in response to an indication that a sensing operation is not valid.

The sense amplifier may carry out the sensing operation in response to an enable signal and the error detection circuitry may be configured to determine a delay in the provision of the enable signal in response to the indication.

The sense amplifier may include: sensing circuitry configured to carry out the sensing operation on the at least one memory cell; and error detection circuitry configured to determine whether the sensing operation is valid.

The sensing circuitry may include first and second process and hold circuits, each configured to process a difference between a value on a bit line input received at a first node and a value on a compliment bit line input received at a second node and hold the respective first and second nodes at values corresponding to the difference.

The error detection circuitry may be configured to compare the value held at one of the first and second node of the first process and hold circuits and the value held at the other one of the first and second node of the second process and hold circuits.

The first process and hold circuit may be biased towards one of the input on the first node and the input on the second node and the second process and hold circuit may be biased toward the other one of the input on the second node and the input on the first node.

The error detection circuitry may be configured to compare the values held at the respective one of the first and second nodes of the first process and hold circuit and the second process and hold circuit corresponding to the input not biased toward.

For each of the first and second process and hold circuits, the value at one of the first and second node corresponding to the biased toward input may determine the value held at the other one of the first and second node.

According to an embodiment, there may be provided a method including: carrying out a sensing operation on at least one memory cell by a sense amplifier; and determining by the sense amplifier whether the sensing operation is valid.

The method may further include: processing a difference between a value on a bit line input received at a first node and a value on a complement bit line input received at a second node and hold the respective first and second nodes at values corresponding to the difference.

According to an embodiment, there may be provided a sense amplifier including: sensing circuitry configured to carry out a sensing operation on at least one memory cell; and error detection circuitry configured to determine whether the sensing operation is valid.

According to an embodiment, there may be provided a memory block including: memory means for storing a value; sensing means for carrying out a sensing operation on the memory means and for determining whether the sensing operation is valid.

According to an embodiment, there may be provided a sense amplifier including: sensing means for carrying out a sensing operation on at least one memory cell; and error detection means for determining whether the sensing operation is valid.

BRIEF DESCRIPTION OF THE DRAWINGS

Embodiments will be described with the reference to the following figures in which.

DETAILED DESCRIPTION

Embodiments may provide a memory with adaptable timing for memory operations. The operation of a memory may be affected by factors such as operating conditions, process variations, and system requirements. In some embodiments, timing of the memory may be adjusted directly by, for example, adjusting the provision of timing control signal such as a sense amplifier enable signal by introducing delay. In other embodiments the timing may be adjusted indirectly. For example, by adjusting memory power, the delay in the provision of a sense amplifier enable signal required for a correct operation of the memory may be reduced. In additional or alternative embodiments, the delay required in the provision of the sense amplifier enable signal may be reduced by replacing failure-prone memory cells.

In embodiments, timing may be adapted in response to an indication from a sense amplifier. Embodiments may relate to the generation of a sense amplifier enable signal. A sense amplifier enable signal may be generated in some embodiments at a time when a differential voltage provided to a sense amplifier is greater than a minimum differential voltage required by the sense amplifier. Embodiments may also provide sense amplifier circuitry capable of indicating an error in a read operation. For example the sense amplifier may generate an output indicating that a differential voltage provided to the sense amplifier was not greater than a minimum differential voltage required by the sense amplifier. Alternatively or additionally, the sense amplifier may indicate that an error has occurred in a read operation.

Figure 1:
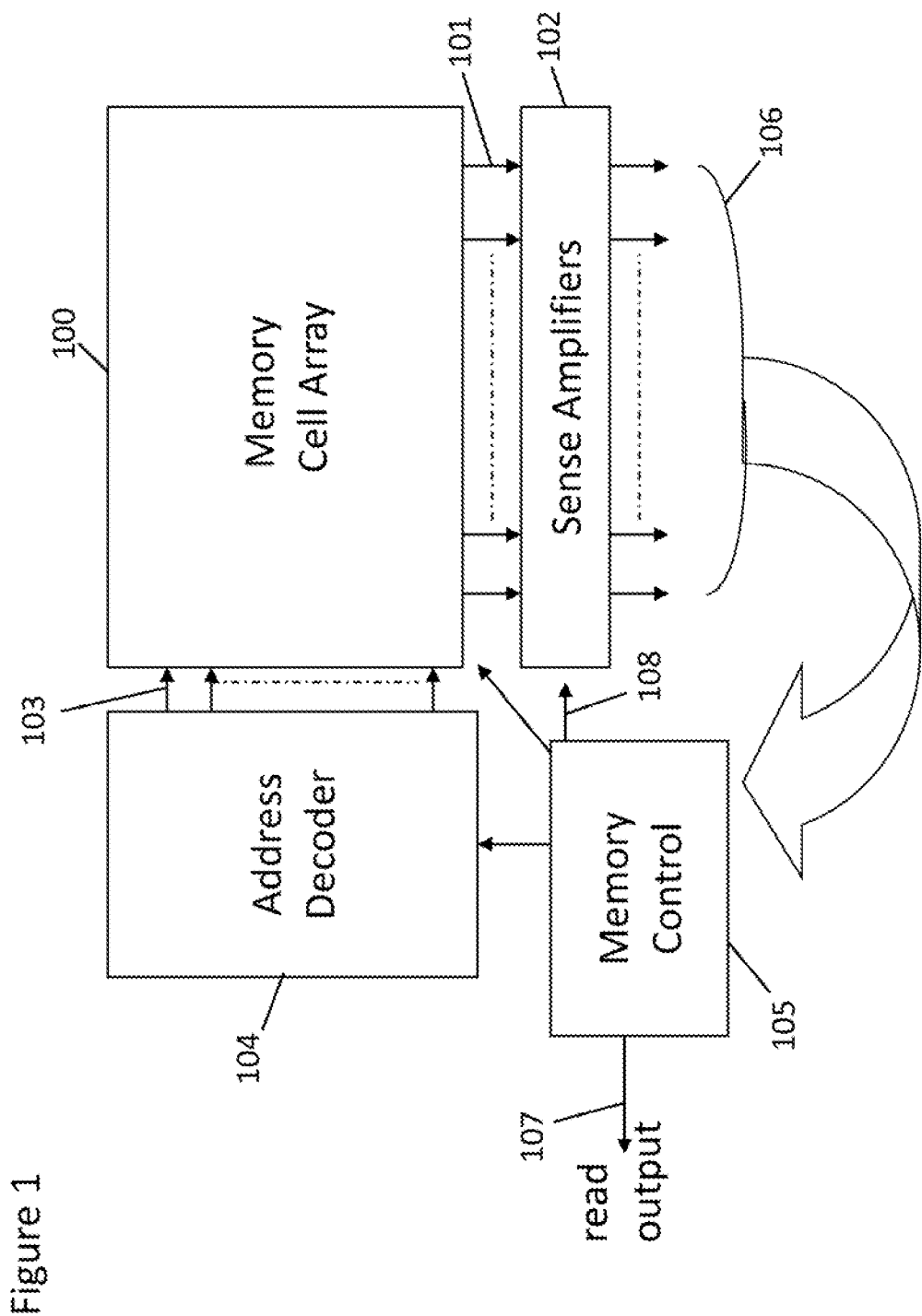
FIG. 1 shows an example of a memory architecture according to some embodiments.

FIG. 1 shows an example of a memory architecture in accordance with an embodiment. FIG. 1 includes a memory cell array 100. The memory cell array 100 may include an array of memory cells arranged in rows and columns. Each row of the memory cell array 100 may be coupled to a respective word line and each column of the memory cells may be coupled to a respective bit line 101. In some embodiments, each respective bit line may be a differential pair, for example, a bit line and an inverted bit line.

It will be appreciated that this is by way of example only, and the memory cell array 100 may be arranged or include any appropriate circuitry for implementing a memory cell array. It will also be appreciated that the circuitry of the memory cells themselves may differ with embodiments and may be any suitable circuitry for storing information.

The memory cells of the memory cell array 100 of FIG. 1 may be configured to store information, for example, a data value such as a logic 1 or logic 0. The memory cells may be coupled to a word line in such a way that an active or asserted word line may address a row of memory cells.

The memory of FIG. 1 may further include an address decoder 104 coupled to the memory cell array 100 via word line control lines 103. The word line control lines 103 may correspond to respective word lines of the memory cell array 100, and may be used to address rows of the memory cell array 100 corresponding to an asserted word line control line 103.

The memory may also include sense amplifiers 102. The sense amplifiers 102 may be coupled to the memory cell array 100 via the bit lines 101 (for example the bit line and inverted bit line for each column). The sense amplifiers 102 may be configured to write to and/or read from a row of memory cells addressed by a word line. The sense amplifiers 102 may provide sense amplifier outputs 106 corresponding to the read information. It is appreciated that in some embodiments, where the sense amplifiers 102 may be used to write to the memory cell array 100, the sense amplifier outputs 106 may also be used as inputs to provide information to the sense amplifiers 102 to be written to the memory cell array 100.

The memory of FIG. 1 may additionally include a memory control block 105. The memory control block 105 may be coupled to one or more of the address decoder 104, the memory cell array 100, and the sense amplifiers 102 via control signals. For example, the memory control block 105 may be coupled to the sense amplifiers 102 via a control line(s) 108. In embodiments, the control line may be a sense amplifier enable signal. In some embodiments, the memory control block 105 may provide a common or respective write and/or read enable signal to the address decoder 104, sense amplifiers 102, and/or the memory cell array 100 via the control lines.

In some embodiments, the memory control block 105 may provide a read output 107. The read output 107 may correspond to information read from the memory cell array 100, and may be provided to further circuitry and/or a system bus. It is appreciated that this is by way of example only, and information read from the memory cell array 100 may be provided to any further circuitry via the sense amplifier outputs 106.

It is also appreciated that in some embodiments, the memory control block 105 may be coupled to the other circuitry of the memory via other signals (not shown).

In operation, the memory of FIG. 1 may carry out a read or a write operation. In some embodiments, the memory control block 105 may control the operation of the memory during the read and/or write operation. Alternatively, in other embodiments, further control circuitry may be provided for controlling memory operation. It is appreciated that a read or write operation may take place in response to a read and/or write enable signal.

In an embodiment, a write enable signal may go low, indicating that a read operation is to take place. The memory control block 105 may control a pre-charge circuit to pre-charge the bit lines. It is appreciated that the pre-charge circuit may form part of the memory cell array 100, the sense amplifiers 102, or may be separate circuitry. Once the bit lines have been pre-charged, the address decoder 104 may assert a word line corresponding to the word in the memory cell array 100 to be read from. In some embodiments, the address decoder 104 may receive an indication of the word to be read and assert the word line via control of the word line control lines 103.

The memory cells coupled to the word line may transfer some of their charge to their respective bit line and inverted bit line. It is appreciated that embodiments may relate to any type of memory using sense amplifiers or their equivalent. For example, embodiments may be applied to semiconductor memories in very-large-scale integration VLSI systems such as Dynamic Random Access Memory (DRAM) or Static Random Access Memory (SRAM). It is appreciated that the architecture of the memory cells and the mechanism of the transfer of charge may differ according to the type of memory; however, it is appreciated that embodiments may be applicable to different memory types.

In some embodiments, a memory cell may actively drive a bit line and inverted bit line to a low and high value in dependence on the value stored in the memory cell. In other embodiments, a memory cell may cause a charge differential on the differential bit lines by transferring or absorbing charge from one or both of the differential bit line pair. A sense amplifier enable signal may then enable the sense amplifiers 102 corresponding to each bit line pair to amplify and hold a voltage difference between the bit line and inverted bit line of the bit line pair.

The value of the bit line and inverted bit line may indicate the value stored by the memory cell. For example, a bit line value of '1' and inverted bit line value of '0' may indicate that a '1' was stored in the memory cell. The sense amplifier 102 may then provide a logic 1 or 0 at the sense amplifier output 106 corresponding to the value stored in the respective memory cell.

In order for information to be read from a memory cell correctly, enough charge should be transferred and/or absorbed from the memory cell differential bit line pair such that a corresponding sense amplifier may amplify and hold the difference. For example, if a sense amplifier is enabled before sufficient charge is transferred to the bit line pair, the difference between the bit line and the inverted bit line may be insufficient for the sense amplifier to successfully provide an output. For example, the sense amplifier may provide an incorrect output (e.g., 0 instead of a 1), or the sense amplifier may provide a default output of 1 or 0.

The minimum differential voltage on a bit line pair required for a successful sensing of data stored in a memory cell may be $V_{critical}$. $V_{critical}$ may be affected by various factors. For example, process voltage and temperate variations of the memory may affect the value of $V_{critical}$. Memories may be subject to dynamic scaling techniques, for example, voltage and/or frequency scaling, in order to improve efficiency and/or increase speed of a memory. This scaling may affect the value of $V_{critical}$ for a sense amplifier. Additionally, the time taken for the differential voltage on a bit line pair to reach $V_{critical}$ may also be affected by such factors.

Embodiments may control the sense amplifiers 102 in order to take factors such as these into account. In some embodiments, operation of a memory may be configured and errors, for example read errors, may be corrected. In some embodiments, a sense amplifier may be provided that provides an indication of whether a sensing operation carried out on a differential bit line pair is valid or not. In some embodiments, the output of a sense amplifier may be corrected.

In some embodiments, errors may be corrected or addressed by determining parameters of the memory. These parameters may be, for example, the timing of the generation of an enable signal, a current supplied to a sense amplifier, a voltage provided to the memory cells, and/or sense amplifier and/or a system clock. It is appreciated that other parameters may be adjusted. Additionally or alternatively, in some embodiments, memory cells may be replaced in response to an error being detected.

In some embodiments, an operation of a sense amplifier may be monitored, and a generation of sense amplifier enable signal may be controlled which may attempt to avoid sensing errors. In some embodiments, parameters of the memory may be controlled in order to decrease the time taken for the differential bit lines to reach $V_{critical}$ in a read operation. In some embodiments, the operation of a sense amplifier may be monitored to determine whether a column of memory cells associated with that sense amplifier should be replaced.

In some embodiments, the memory control block 105 of FIG. 1 may control the generation of the sense amplifier enable signal in response to the behavior of at least one sense amplifier. Additionally, in some embodiments, the memory control block 105 may receive the sense amplifier outputs 106 and provide correction before providing the sense amplifier outputs to further circuitry, for example, a system bus.

In operation, once the memory control block 105 receives an indication (from a sense amplifier or in the form of an invalid signal), the control block may control a correction of the read operation. For example, in some embodiments, the read operation may be carried out again with a longer time period between coupling the pre-charged bit lines to the memory cell and enabling the sense amplifiers. Alternatively or additionally, for example, a voltage supplied to the sense amplifier, the memory, and/or pre-charge of the differential bit lines may be adjusted.

In some embodiments, the memory control block 105 may replace a column of memory cells that indicate an invalid operation with a back-up or redundant column of memory cells. A row and/or column of memory cells may be replaced. In some embodiments, a sense amplifier may be replaced. In other or additional embodiments, a data path in the memory may be replaced. Alternatively, no action may be taken in the memory in response to an invalid operation, and a controller for the memory may implement changes in other parts of system in which the memory is a part to address any error.

Figure 2:
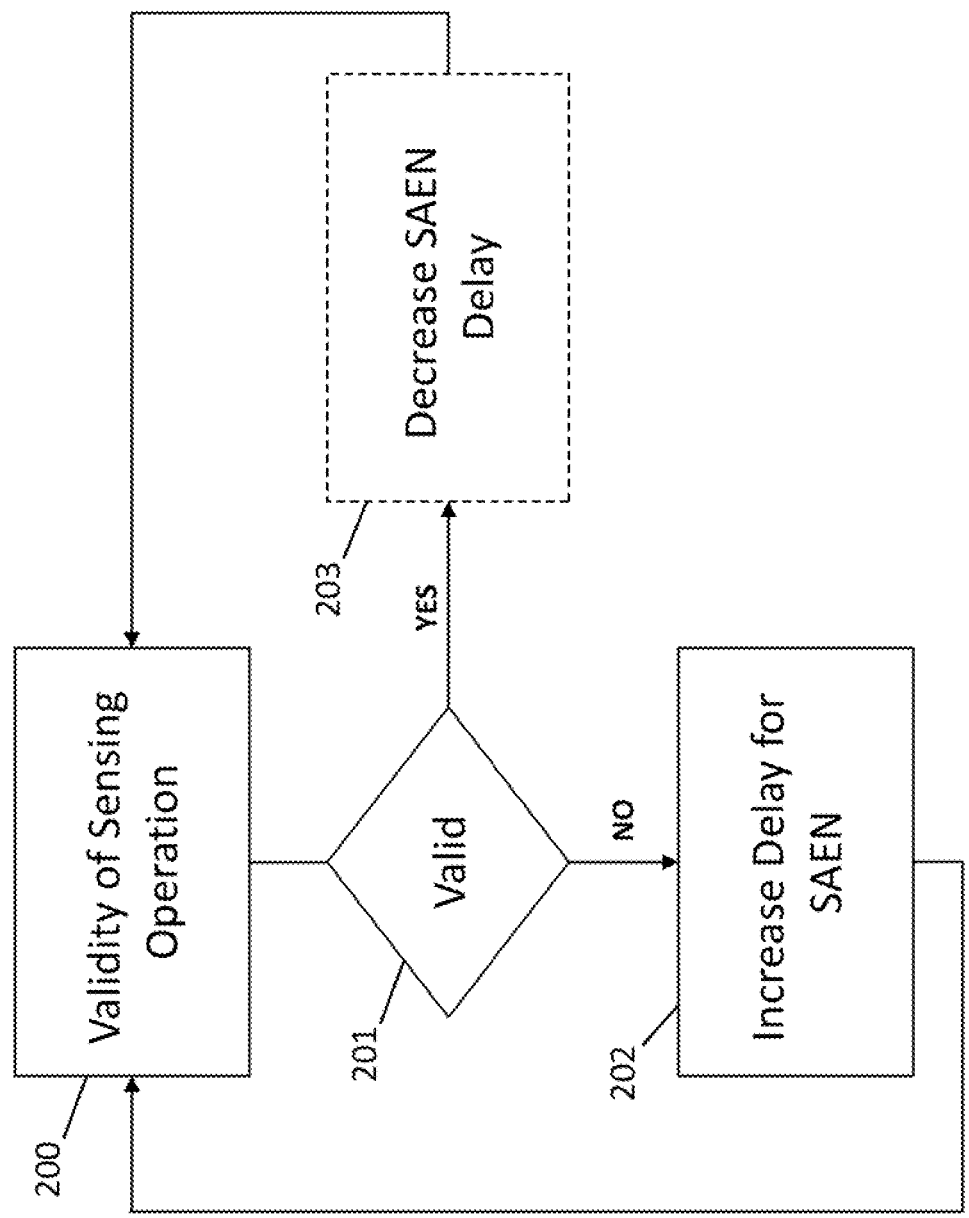
FIG. 2 shows and example of method carried out by some embodiments.

FIG. 2 shows an example of a method carried out by embodiments. It is appreciated that in some embodiments, the method of FIG. 2 may be carried out in conjunction with the circuitry of FIG. 1. For example, the method of FIG. 2 may be carried out by the memory control block 105.

At step 200 of FIG. 2, the control circuitry, for example, the memory control block 105, receives an indication from a sense amplifier whether or not a sensing operation is valid. The indication may indicate that a differential voltage on a bit line pair was sufficient for the sensing operation to take place without error. The indication may be an indication of whether or not an error in the sensing operation has been detected. In some embodiments, the control circuitry may receive an indication from each sense amplifier, a combined signal indicative of the indication from each sense amplifier, or an indication from only one or some of the sense amplifiers. The sense amplifiers may provide an indication of whether or not the differential voltage $V_{diff}$ input into the sense amplifier was greater than $V_{critical}$.

A determination is made at step 201 of whether the sensing operation was valid, for example, a determination of whether $V_{diff}$ was greater than $V_{critical}$. If the sensing operation was valid (for example if $V_{diff}$ was greater than $V_{critical}$), then the time between the assertion of the word line and provision of the sense amplifier enable signal was long enough for enough charge to be transferred to satisfy $V_{critical}$. In this case, the method returns to step 200.

In some embodiments, a delay of providing the sense amplifier enable signal may be decreased as shown by optional step 203. It is appreciated that this may only be under certain conditions. For example, the delay may be decreased if no error occurs for a given delay in the provision of the sense amplifier enable signal. The detection of no delay may indicate that the speed of the memory may be increased without error. Alternatively, other parameters may be adjusted in response to the detection of a successful operation. For example a voltage supplied to the memory may be reduced until a fail is detected.

If the sensing operation is determined to be invalid (for example, if $V_{diff}$ was not greater than $V_{critical}$), then the memory may require a longer time between the assertion of the word line and the provision of the sense amplifier enable signal to the sense amplifier for the transfer of charge. In this case, the method progresses to step 202, where a delay in the provision of the sense amplifier enable signal to the sense amplifiers 102 is increased. The method may then return to step 200, where indications of a next read operation are received.

In embodiments, a delay is introduced in the enablement of the sense amplifiers in order to provide enough time for charge to be transferred from a memory cell to the bit lines.

In the example of FIG. 2, a delay in the provision of a sense amplifier enable signal is adjusted in response to an invalid indication. It is, however, appreciated that other responses to an invalid indication are possible. For example, a voltage supplied to the memory may be adjusted. The adjustment in voltage may affect, for example, the minimum time required for sufficient charge to be transferred to the pre-charged bit lines from a memory cell. In this case, although a delay in the provision of the sense amplifier enable signal is not adjusted, the sense amplifiers may not detect an invalid operation at the next read due to the voltage adjustment. It is appreciated that the memory control block 105 may implement dynamic voltage scaling based on this. Additionally or alternatively, other parameters may be adjusted. The parameters (for example, voltage, frequency, and/or delay) may be determined by performance requirements of a memory. For example, in a high speed memory, the delay may be minimized at the expense of power consumption, whereas in a low power memory, power consumption may be reduced at the expense of speed.

Figure 3:
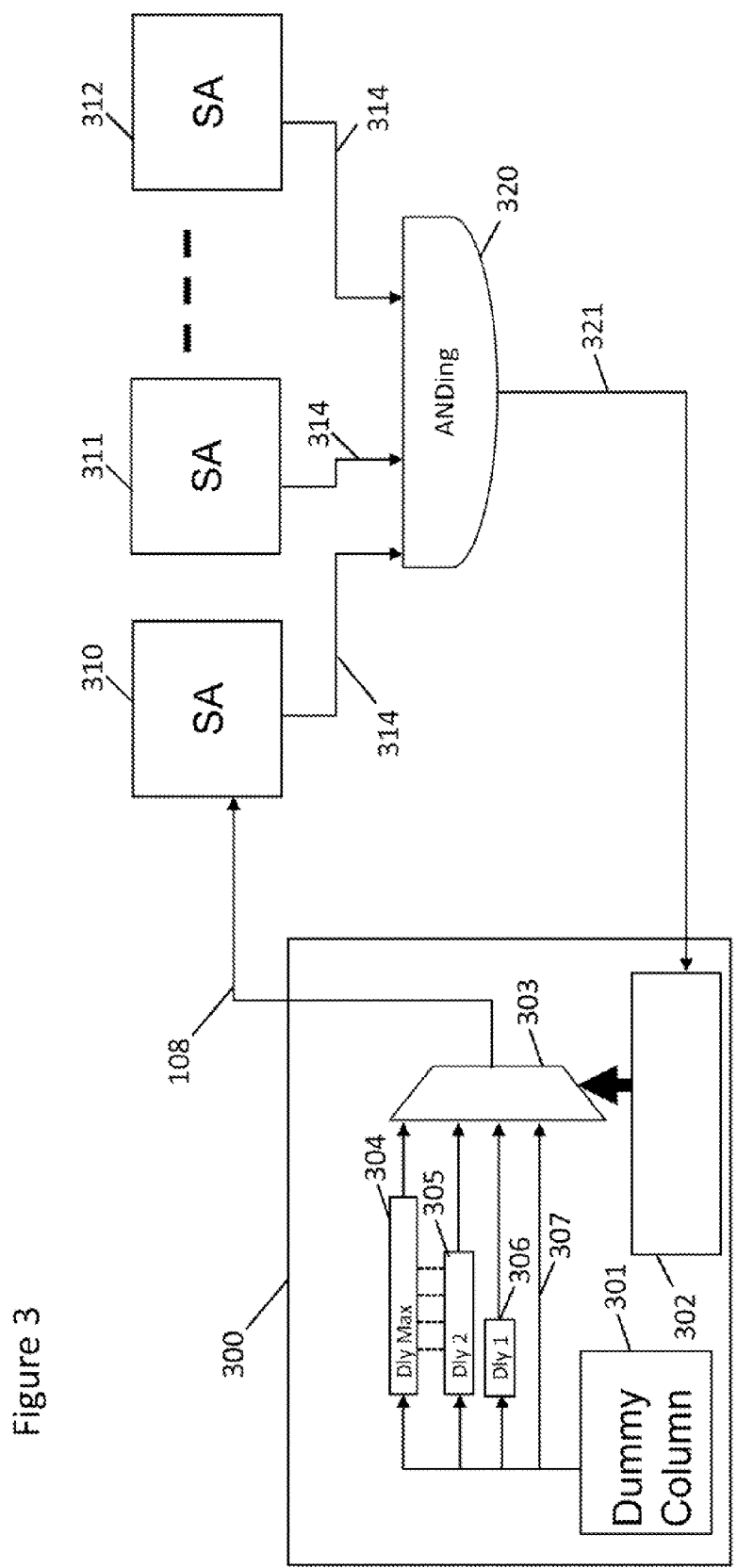
FIG. 3 shows an embodiment of memory circuitry with an adjustable delay.

FIG. 3 shows an embodiment of the memory control block 105 of FIG. 2 and part of the sense amplifiers 102.

It is appreciated that in some embodiments, FIG. 3 shows only part of the circuitry of the memory control block 105 of FIG. 1, and the memory control block 105 may include further circuitry, for example, for the control of the address decoder 104 and provision of a write enable signal.

FIG. 3 shows a dummy referencing block 300. The dummy referencing block 300 may form part of the memory control block 105 in some embodiments. The dummy referencing block provides an output 108 to sense amplifiers 310, 311 and 312. It is appreciated that the sense amplifiers 310, 311, and 312 may form part of the sense amplifiers 102 of FIG. 1. It is also appreciated that the output 108 may correspond to the sense amplifier enable signal 108 of FIG. 1 and may be provided to the sense amplifiers 102. It is appreciated that more than the three sense amplifiers 310, 311, and 312 may be provided, and this is indicated by the dashed line.

Each sense amplifier 310, 311, 312 may be coupled to a differential bit line pair and provide an output 314. The outputs 314 may be an indication of whether a sensing operation is valid. For example, the indications 314 may correspond to whether or not the differential voltage on the bit line pair is greater than a critical voltage $V_{critical}$ for the sense amplifier.

It is also appreciated that the sense amplifiers may have a further output corresponding to a sensed value stored in a respective memory cell.

The indications 314 are input into an AND gate 320. The AND gate 320 provides an output 321 to the dummy referencing block 300. In one example, an indication 314 of a sense amplifier may be a logic '1' if the differential voltage is greater than a critical voltage. The AND gate 320 may AND the indications 314 from each sense amplifier. If the differential voltage of one of the sense amplifiers is less than a critical voltage, then that sense amplifier indication 314 will be a logic '0' and the AND gate 320 may output a logic '0'.

The dummy referencing block 300 may include a dummy column 301. The dummy column 301 may be a column of memory cells similar to the columns of memory cells in the memory cell array 100. The dummy column 301 may be manufactured with the memory cell array 100 and may be subject to the same process variations as the memory cell array 100. In some embodiments, the dummy column may be used as a feedback of behavior of the memory cell array 100. This may be because the dummy column behaves similarly to the memory cell array 100.

The dummy column 301 may be used in the generation of self-timing signals for the memory. For example, the dummy column may be used to generate an initial sense amplifier enable signal according to memory self-timing. The dummy column may include a number of memory cells and may generate a reference signal by discharging a bit line of the dummy column 301. The reference signal may be used to generate a sense amplifier enable signal, which may further be delayed in some embodiments.

The dummy column 301 may provide a sense amplifier enable signal output to a number of delay lines 304, 305, 306, and 307. Each of the delay lines 304, 305, 306, and 307 may correspond to a different delay. For example, the delay line 307 may provide no delay and the delay line 304 may provide a maximum delay. The delay lines 305 and 306 may provide delays between the maximum delay line 304 and the no delay line 307.

It is appreciated that while four delay lines are depicted in FIG. 3, more or fewer lines may be implemented in embodiments. It is also appreciated that the delay lines may incorporate any circuitry capable of causing a delay, and may, in some embodiments, be programmable.

The delay lines 304, 305, 306, and 307 may form inputs to a multiplexor 303. The multiplexor 303 may have a selection input coupled to the output of a counter 302. A count value of the counter, provided on the counter output, may select one of the delay lines 304, 305, 306, and 307. The multiplexor 303 may provide the sense amplifier enable signal output delayed by the selected delay line 304, 305, 306, or 307.

In operation, the sense amplifiers may provide an indication of a valid sensing operation, for example an indication of whether a voltage difference on a respective bit line pair satisfies the critical voltage requirement. If at least one of the sense amplifiers has insufficient differential voltage, the AND gate 320 provides a logic '0' as the input the counter 302. It is appreciated that this is by way of example only, and other logic gates or circuitry may be implemented to provide an indication that at least one sensing operation may be invalid.

The logic '0' from the AND gate 320 may cause the counter 302 to increment. In this embodiment, the counter may be a hot counter and may be implemented with a ring buffer. The count value from the counter 302 may be provided to the multiplexor 303 and used to select one of the delay lines 304, 305, 306, and 307. For example, a count value may correspond to a delay line input—if the count value is 0, then the delay line 307 may be selected, if the count value is 1, then the delay line 306 may be selected, etc. It is appreciated that any correspondence between the delay line and count value may be used.

In this manner, a first error (corresponding to an invalid sensing operation) may increase a delay of the sense amplifier enable signal; the second error may increase the delay; etc. until a maximum delay is reached. When the sense amplifier enable signal is generated by the dummy column 301, it is first delayed by the respective delay lines. The multiplexor may couple the selected delay line to the sense amplifier enable signal output 108, and the sense amplifier enable signal will be output on the sense amplifier enable output 108 in accordance with the selected delay.

In embodiments, the enablement of the sense amplifiers may be controlled in order to provide sufficient time for charge to be transferred from a memory cell. In some embodiments, the enablement of the sense amplifiers may be controlled to minimize power consumption. For example, a voltage of the memory may be lowered to conserve power, which may result in a longer delay being required for the sense amplifier enable signal. In other embodiments, an enablement of the sense amplifiers may be controlled to increase a memory speed. For example, the delay may be set to a minimum and other parameters, for example, a voltage of the memory may be adjusted for correct operation.

It is appreciated that the memory control block may include other control circuitry for other parameters in the memory, such as a clock frequency or voltage level, which may be controlled in conjunction with the enablement of the sense amplifiers.

In some embodiments, sensing operation validity signals may be monitored for each sense amplifier. Some embodiments may implement redundant or spare columns. If, for example, it is determined that one column of the memory array fails more often than the other columns, that column may be disconnected and replaced by a redundant column.

Figure 4:
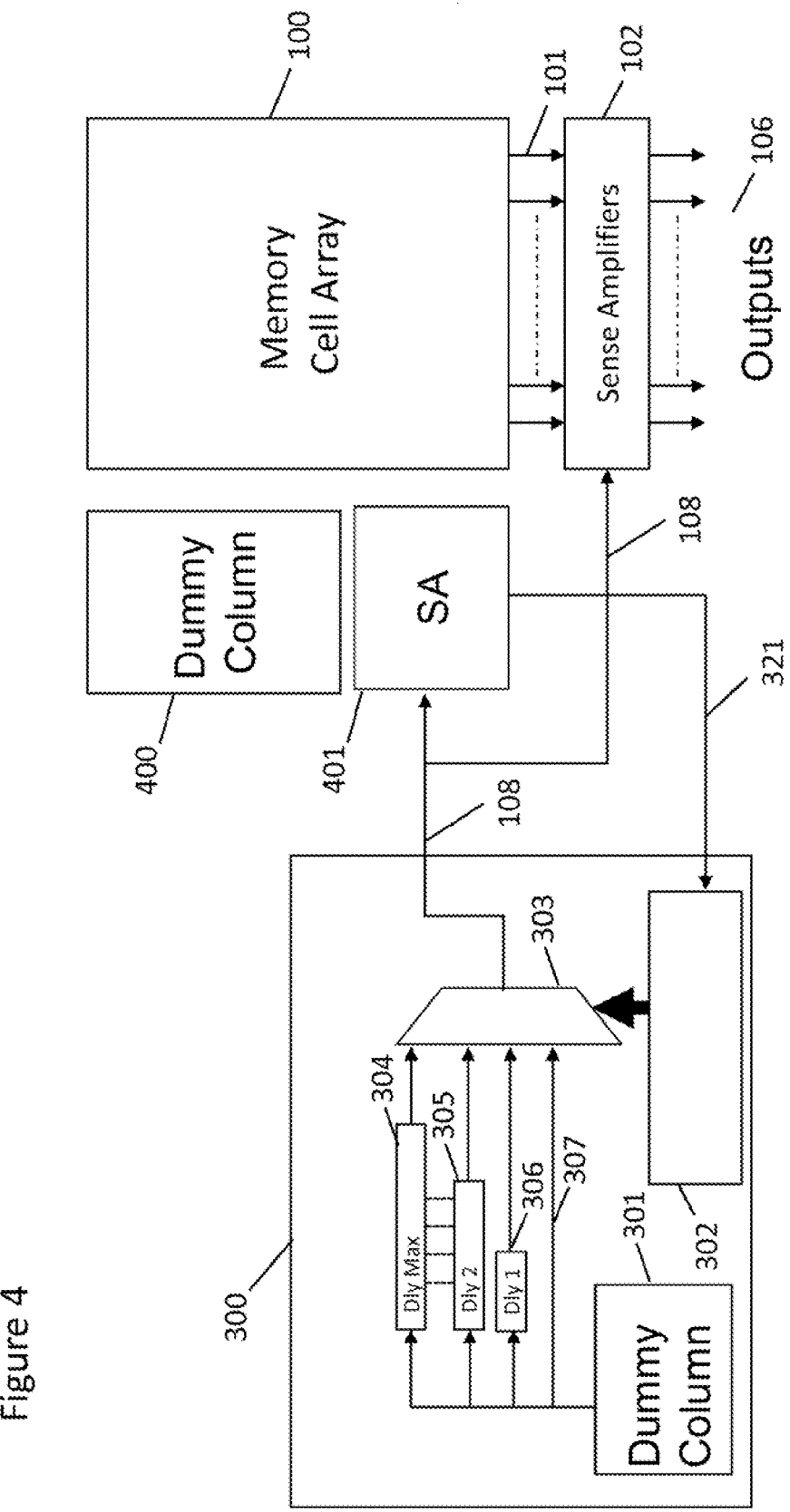
FIG. 4 shows an embodiment of memory circuitry with an adjustable delay.

FIG. 4 shows another embodiment of the memory. Alternatively to the embodiment of FIG. 3, the signal 321 of FIG. 4 is generated by a sense amplifier 401 of a dummy column 400.

The dummy referencing block 300 of FIG. 4 is similar to that of FIG. 3. The dummy referencing block 300 provides the sense amplifier enable signal 108 to the sense amplifiers 102 coupled to the memory cell array 100 via the bit line pairs 101. The sense amplifiers 102 may provide sense amplifier outputs 106. It is appreciated that this may be similar to the circuitry of FIG. 1.

The sense amplifier enable signal 108 of FIG. 4 may also be provided to a sense amplifier 401 of a dummy column 400. In some embodiments, the dummy column 301 and the dummy column 400 may be the same column. In other embodiments, the dummy column 301 and the dummy column 400 may be different columns.

Similar to dummy column 301, the dummy column 400 and sense amplifier 401 may have been manufactured with the memory cell array 100 and sense amplifiers 102, and may have been subjected to the same manufacture and process variations. The dummy column 400 and sense amplifier 401 may, therefore, provide a similar indication 321 of whether a differential voltage on a different bit line pair of the dummy column 400 is greater than a critical voltage.

Alternatively or additionally, the dummy column 400 and sense amplifier 401 may be modified to be more likely to have an invalid sensing operation than the memory cell array 100 and sense amplifiers 102. This may be done, for example, by modifying operating parameters of the dummy column 400 and the sense amplifier 401, for example, by decreasing a power provided to the sense amplifier 401 and dummy column 400. Alternatively or additionally, a mismatch of the components of the dummy column 400 and sense amplifier 401 may be increased.

The indication 321 from the sense amplifier 401 may be provided to the dummy referencing block. It is appreciated that the dummy referencing block 300 of FIG. 4 operates similarly to that of FIG. 3.

In some embodiments, only one sense amplifier may provide an indication of an invalid operation, in other embodiments two or more sense amplifier may provide an indication. The capability of providing an indication may be selectable in some embodiments. For example, sense amplifiers for columns of memory cells that tend to fail may be enabled to provide an indication. For example, some of the memory cells may be affected by random dopant fluctuations and may require a longer period between coupling of the pre-charged bit lines and enablement of the sense amplifiers for successful operation under the same conditions as other memory columns. In some embodiments, these affected memory cells may be read via a delay path for the sense amplifier enable signal while the other memory cells may be read without the delay path. In some embodiments, the delayed sense enable signal may be provided to some of the sense amplifiers and a non-delayed signal to other sense amplifiers.

Figure 5:
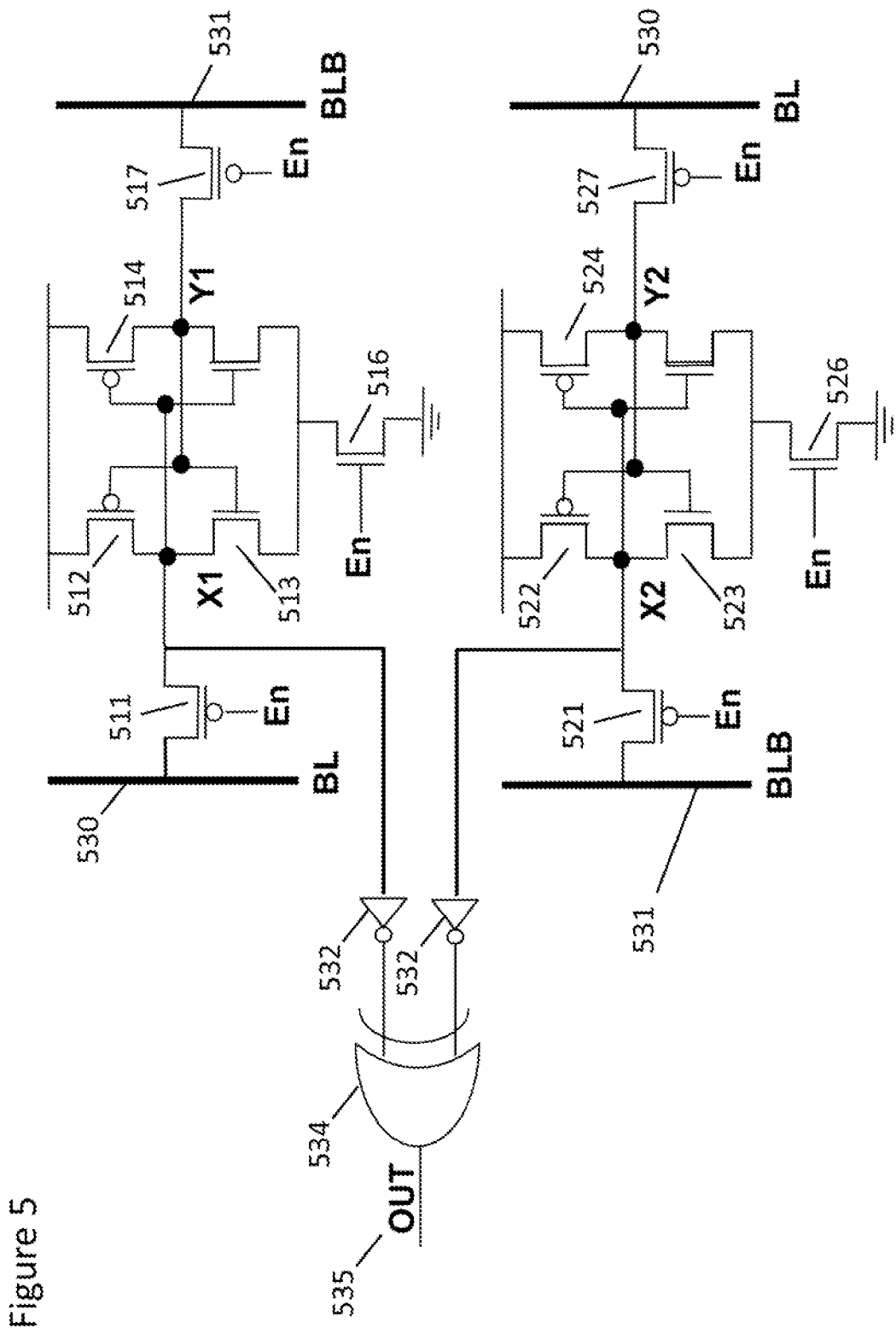
FIG. 5 shows an example of a sense amplifier according to some embodiments.

FIG. 5 shows an example of a sense amplifier in accordance with embodiments. It is appreciated that the sense amplifier of FIG. 5 may be implemented as any sense amplifier in the foregoing configured to provide an indication such as indication 321 or indications 314. As such, the sense amplifier block 102 may be implemented with the sense amplifier of FIG. 5 in some embodiments. In other embodiments, only one or some sense amplifiers may be implemented in accordance with the sense amplifier of FIG. 5.

A sense amplifier according to embodiments may be coupled to a bit line BL and an inverted bit line BLB. When a word line is asserted, an addressed memory cell may pull one of this bit line pair high and the other low, creating a differential voltage across the bit line pair. When the sense amplifier enable signal En having an active logic high value is provided to the sense amplifier, the sense amplifier may amplify and hold the difference between the lines, driving one of the sense-amplifier input/output nodes high and the other sense-amplifier input/output nodes low.

When the differential voltage $V_{diff}$ created by the memory cell on the bit line pair is too low, the sense amplifier may not operate correctly, and thus may not drive the correct output nodes low and high, respectively.

In embodiments, a validity of the sensing operation may be detected by providing the sense amplifier as two imbalanced differential amplifiers. The first differential amplifier may have a first node coupled to the inverted bit line BLB and a second node coupled to the bit line BL. The second differential amplifier may have a first node coupled to the bit line BL and a second node coupled to the inverted bit line BLB.

The first and second differential amplifiers may be such that they are biased towards an input on either a bit line or compliment/inverted bit line input. The first and second differential amplifiers may be biased on opposite inputs. It is appreciated that the biased towards input may be considered a 'stronger' input as a value on the other input may be determined by a value on the biased towards input.

For example, either the first nodes or the second nodes form the stronger or biased toward input to the amplifier. During a read operation, the value at the nodes corresponding to the weaker inputs, or not biased toward inputs, of the amplifiers are compared. If the weaker nodes hold the same value, a sensing operation is invalid.

For example, the first and second amplifiers of FIG. 5 are imbalanced such that the second nodes are the stronger nodes. During a read operation, if $V_{diff}$ is greater than $V_{critical}$, then the difference between the first and second nodes (from the bit line pair) will be large enough for the sense amplifier to sense correctly.

If $V_{diff}$ is less than $V_{critical}$, then the second node will be considered to be a default value (for example a high or a low) by the sense amplifier and invert the first node at both the first and second differential amplifiers. In this case, both the first nodes of the differential amplifiers will be same and the sensing operation will be indicated as invalid.

It will be appreciated that the differential amplifier may be imbalanced (or be biased toward an input) in a variety of manners. For example, transistors in a differential amplifier may have different sizes and/or have different capacitances. Alternatively or additionally, charge may be injected into the circuit.

FIG. 5 shows an example of circuitry for the implementation of a sense amplifier according to some embodiments.

FIG. 5 includes a first differential amplifier 510 and a second differential amplifier 520. An output from a first node X1 of the first differential amplifier 510 and an output of a first node X2 of the second differential amplifier 520 are provided via respective inverting delays 532 to an XOR gate 534, which provides an output 535.

The first differential amplifier 510 includes a first p-channel transistor 511 having a gate terminal coupled to an enable signal En and a source terminal coupled to a bit line BL. A drain terminal of the first p-channel transistor 511 is coupled to the first node X1 and further to respective drain terminals of a third p-channel transistor 512 and a first n-channel transistor 513.

The first differential amplifier 510 also includes a second p-channel transistor 517 having a gate terminal coupled to the enable signal En and a source terminal coupled to an inverted bit line BLB. A drain terminal of the second p-channel transistor 517 is coupled to a second node Y1 and further to respective drain terminals of a fourth p-channel transistor 514 and a second n-channel transistor 515.

A respective source terminal of the third p-channel transistor 512 and the fourth p-channel transistor 514 are coupled to a power source for the sense amplifier. A respective source terminal of the first n-channel transistor 513 and the second n-channel transistor 515 are coupled to a drain terminal of a third n-channel transistor 516. A source terminal of the third n-channel transistor 516 is coupled to ground, and a gate terminal of the third n-channel transistor is coupled to the enable signal En.

A gate terminal of the third p-channel transistor 512 is coupled to a gate terminal of the first n-channel transistor 513 and coupled to the second node Y1. A gate terminal of the fourth p-channel transistor 514 is coupled to a gate terminal of the second n-channel transistor 515 and further coupled to the first node X1.

The second differential amplifier 520 may have similar structure to the first differential amplifier 510. The second differential amplifier 520 includes a first p-channel transistor 521 having a gate terminal coupled to the enable signal En and a source terminal coupled to the inverted bit line BLB. A drain terminal of the first p-channel transistor 521 is coupled to the first node X2 and further to respective drain terminals of a third p-channel transistor 522 and a first n-channel transistor 523.

The second differential amplifier 520 also includes a second p-channel transistor 527 having a gate terminal coupled to the enable signal En and a source terminal coupled to the bit line. A drain terminal of the second p-channel transistor 527 is coupled to a second node Y2 and further to respective drain terminals of a fourth p-channel transistor 524 and a second n-channel transistor 525.

A respective source terminal of the third p-channel transistor 522 and the fourth p-channel transistor 524 are coupled to a power source for the sense amplifier. A respective source terminal of the first n-channel transistor 523 and the second n-channel transistor 525 are coupled to a drain terminal of a third n-channel transistor 526. A source terminal of the third n-channel transistor 526 is coupled to ground and a gate terminal of the third n-channel transistor is coupled to the enable signal En.

A gate terminal of the third p-channel transistor 522 is coupled to a gate terminal of the first n-channel transistor 523 and coupled to the second node Y2. A gate terminal of the fourth p-channel transistor 524 is coupled to a gate terminal of the second n-channel transistor 525 and further coupled to the first node X1.

The enable signal En at the gates of transistors 511, 517, 521, 527, 516, and 526 may correspond to the sense amplifier enable signal in some embodiments, or may be a different signal derived from the sense amplifier enable signal in other embodiments. For example, the enable signal En may be a pass enable signal.

In operation, during a read operation, the bit line BL and the inverted bit line BLB may be precharged before a word line is asserted for the addressed cells. The pre-charge may be carried out in response to a pre-charge enable signal. This precharge may correspond to a logic '1' of the pre-charge enable signal in some embodiments. When the word line is asserted, the addressed memory cells may be coupled to the respective pre-charged bit line pairs corresponding to those cells. Furthermore, during the precharge period, the signal En has an inactive level (here a logic low level), so that the transistors 511, 517, 521, and 527 are "on", and the transistors 516 and 526 are "off".

Once coupled to the bit line pair while the corresponding word line is asserted, a memory cell may drive one line of the bit line pair toward high and the other toward low. This may be through discharging one of the bit lines. For example, if a memory cell is storing a '1', when the bit line pair is coupled, the memory cell may start to discharge the inverted bit line BLB and drive the bit line BL high. If the memory cell is storing a '0', the inverted bit line BLB may be driven high and the bit line BL may start to be discharged or pulled low.

The sense amplifier of FIG. 5 may sense a voltage difference between the bit line BL and inverted bit line BL and amplify and hold this difference. The sense amplifier may drive one line of the bit line pair high and the other low, and output the value of the memory cell on the sense-amplifier outputs X1, X2, Y1, and Y2.

For example, during a read operation, the bit line BL, inverted bit line BLB, and the nodes X1 and Y1 of FIG. 5 may be pre-charged while the signal En is inactive low. A word line corresponding to a word of memory cells to be read may then be asserted and the memory cell being read by the sense amplifier of FIG. 5 may start to pull one of the bit line pair high and the other low. The enable signal En may then be asserted active logic high, thus uncoupling the first node X1 of the first differential amplifier 510 from the bit line BL and the second node Y1 of the first differential amplifier 510 from the inverted bit line BLB, as well as coupling the respective sources of the first and second n-channel transistor 513 and 515 to ground via the on third n-channel transistor 516.

If the memory cell was storing a '1', then the node X1 would start to be pulled high and the node Y1 would start to be pulled low. The higher value at the first node X1 is coupled to the gates of the fourth p-channel transistor 514, tending to turn it off, and to the gate of the second n-channel transistor 515, tending to turn it on. The tending-toward-on second n-channel transistor 515 may pull the second node Y1 toward low, which may pull the gate terminals of the third p-channel transistor 512 and the first n-channel transistor toward low, tending to turn the first n-channel transistor 513 off and the third p-channel transistor 512 on.

The tending-toward-on third p-channel transistor 512 may pull the first node X1 toward high while the tending-toward-on second n-channel transistor 515 pulls the second node Y1 toward low.

Thereafter, the first differential amplifier 510 pulls the node X1 high and pulls the node Y1 low; therefore, after En transitions to an active logic high, X1 and Y1 provide the read signal for a corresponding bit of the read data.

The second differential amplifier may operate similarly except that the inverted bit line BLB is coupled to the first p-channel transistor 521 and pulls the first node X2 toward low while the second node Y2 is pulled toward high by the bit line BL.

It can be seen that while the enable signal En is active high, the differential amplifier 510 may operate as an inverter, inverting the high value at node X1 to a low value at node Y1, and inverting the low value at node Y1 to a high value at node X1. The second node Y1 may be a stronger inverting input. In other words, if the first node X1 and the second node Y1 were input the same value, for example '1', the second node Y1 would invert the first node X1 as it is the stronger inverted node—for example Y1 would be '1' and X1 would be inverted to '0'.

In order for the first differential amplifier 510 to provide values at the first node X1 and the second node Y1 corresponding to the value stored in the memory cell, the voltage difference between the bit line BL and inverted bit line BLB must be greater than a voltage threshold for the operation of the first differential amplifier. In other words Vdiff>Vcritical.

The second differential amplifier may be similar to the first differential amplifier except that the second node Y2, which is the stronger inverting input node, corresponds to the value of the bit line BL, and not the inverted bit line BLB, as in the first inverting amplifier.

In other words, if Vdiff is insufficient, the high value induced by the inverted bit line BLB at node Y1 will invert node X1 to a low value after En transitions to an active logic high, and the high value induced by the bit line BL at node Y2 will invert the node X1 to a low value after En transitions to an active logic high. The XOR gate 534 receives the value of the first node X1 of the first inverting amplifier 510 and the first node X2 of the second inverting amplifier 520 and, after En transitions to an active logic high, provides an indication of whether these values at the nodes X1 and X2 are the same. If the values are the same, it may be determined that $V_{diff}$ was not $>V_{crtitical}$.

So in summary according to an embodiment, first, the bit line BL and inverted bit line BLB are precharged, e.g., to a logic 1, while En is inactive logic low.

Next, a word line is activated so as to couple a memory cell to the precharged lines BL and BLB.

Then, at some time after the word line is activated, En transitions to an active logic high.

If Vdiff>Vcritical, then the voltage difference across BL and BLB is sufficient to drive nodes X1 and Y2 toward the logic level on BL, and to drive the nodes X2 and Y1 toward the logic level on BLB. Because En is an active logic high, it causes the transistors 511, 517, 521, and 527 to deactivate and isolate the nodes X1, Y2 and X2, Y1 from BL and BLB, respectively, so that the sense amplifier fully drives nodes X1 and Y2 to the logic level previously on BL (while En was at a logic low) and fully drives nodes X2 and Y1 to the logic level previously on BLB. Because X1≠X2, the gate 534 indicates that the data output by the sense amplifier on nodes X1, X2, Y1, and Y2 is valid.

In contrast, if Vdiff≤Vcritical, then the voltage difference across BL and BLB is insufficient to drive nodes X1 and Y2 toward the logic level on BL, and to drive the nodes X2 and Y1 toward the logic level on BLB. Because En is an active logic high, it causes the transistors 511, 517, 521, and 527 to deactivate and isolate the nodes X1, Y2 and X2, Y1 from BL and BLB, respectively, so that the sense amplifier fully drives nodes X1 and X2 to a logic low level and fully drives nodes Y1 and Y2 to a logic high level, because the nodes Y1 and Y2 are the stronger inverting nodes (if X1 and X2 where the stronger inverting nodes, then the sense amplifier would fully drive nodes X1 and X2 to a logic high level and nodes Y1 and Y2 to a logic high level). Because X1=X2, the gate 534 indicates that the data output by the sense amplifier on nodes X1, X2, Y1, and Y2 is invalid.

It is appreciated that this is by way of example only, and the comparison may be made on the stronger inverting node of each differential amplifier. Additionally, the first node of each amplifier 510 and 520 may be made the stronger input.

Moreover, the read output form the sense amplifier of FIG. 5 may be derived from X1-Y1, X2-Y2, or both X1-Y1 and X2-Y2, when the output of the XOR gate 534 equals a logic 1.

Although the foregoing has described transistors as being n-channel and p-channel MOSFETs, it is appreciated that other circuitry may be used. For example, other types of transistors may be used to implement circuitry, and the channel type of the transistors may change with subsequent modification to the circuitry.

Although the foregoing has described a bit line and inverted bit line as forming part of a differential pair, it is appreciated that a compliment bit line and bit line may form the pair, the terms inverted bit line and compliment bit lines being interchangeable.

It is appreciated that embodiments may be implemented in conjunction with multiplexed memories. For example, a sense amplifier may be associated with more than one column of memory cells and a column to be operated on may be selected. For example the sense amplifiers may be used to carry out a memory operation on one set of memory cells under a first condition (for example those memory cells being selected) and a second set of memory cells under a second condition (for example the second set of memory cells being selected). In some embodiments, the memory may be for example a mux-2 or mux-4 memory and a sense amplifier may be associated with 2 or 4 columns of memory cells, respectively.

It is also be appreciated that a signal indicating an error in operation of the memory may be used by any appropriate circuitry within or additional to the memory. For example, such a signal may be provided to circuitry external to the memory and may be used to correct an error or compile information regarding the error. In some embodiments, for example, such a signal may be provided from a cache memory to a processor within a system in which the memory is implemented.

It is also appreciated that the circuitry of the imbalanced differential amplifiers is by way of example only, and other circuitry may be used to implement the amplifiers.

In addition, an embodiment of a memory, such as an embodiment of the memory of FIG. 1, may be combined with one or more other integrated circuits, such as a controller, e.g., a processor, to form a system, where the memory and other integrated circuit(s) may be disposed on a same die (e.g., system on a chip) or on a different die.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A sense amplifier, comprising:
a sense circuit configured to convert a first signal that corresponds to data stored in a memory cell into a second signal that corresponds to the data; and
a monitor circuit configured to receive the first signal and to indicate a reliability of the second signal.

2. The sense amplifier of claim 1 wherein the sense circuit includes:
first and second differential nodes configured to receive first and second differential components of the first signal and to provide first and second differential components of the second signal;
a first inverter having input and output nodes respectively coupled to the first and second differential nodes; and
a second inverter having input and output nodes respectively coupled to the second and first differential nodes.

3. The sense amplifier of claim 1 wherein:
the first signal includes a differential signal; and
the monitor circuit is configured to indicate the reliability of the second signal by indicating a magnitude of the differential signal.

4. The sense amplifier of claim 1 wherein:
the first signal includes a differential signal; and
the monitor circuit is configured to indicate the reliability of the second signal by indicating a relationship between a magnitude of the differential signal and a threshold.

5. The sense amplifier of claim 1 wherein the monitor circuit is configured to indicate the reliability of the second signal by generating a monitor signal that is indicative of the reliability of the second signal.

6. A read circuit, comprising:
at least one sense amplifier, including:
a sense circuit configured to convert a first signal that corresponds to data stored in a memory cell into a second signal that corresponds to the data; and
a monitor circuit configured to generate a monitor signal from the first signal that indicates a reliability of the second signal; and
a sense-amplifier controller, including:
a delay circuit configured to enable the at least one sense amplifier to convert the first signal into the second signal a delay time after commencement of a read operation; and
a calibration circuit configured to adjust the delay time in response to the monitor signal.

7. The read circuit of claim 6, further including:
multiple sense amplifiers;
a generator configured to generate a combined monitor signal in response to the respective monitor signals from the sense amplifiers; and
wherein the calibration circuit is operable to adjust the delay time in response to the combined monitor signal.

8. The read circuit of claim 6 wherein the delay circuit includes:
a column of memory cells configured to delay a first intermediate time after the commencement of a read operation;
delay paths each configured to delay a respective second intermediate time after the first intermediate time; and
a path selector configured to select one of the delay paths in response to the calibration circuit and to set the delay time approximately equal to a sum of the first intermediate time and the second intermediate time of the selected delay path.

9. The read circuit of claim 8 wherein the column includes a dummy column.

10. The read circuit of claim 8 wherein the column includes a last non-redundant column in a row-column array of memory cells.

11. The read circuit of claim 8 wherein at least one of the delay paths is configured to delay a respective second intermediate time that is approximately equal to zero.

12. The read circuit of claim 6 wherein the at least one sense amplifier includes a dummy sense amplifier.

13. An integrated circuit, comprising:
at least one memory cell configured to store data; and
a read circuit, including:
at least one sense amplifier, including:
a sense circuit configured to convert a first signal that corresponds to the stored data into a second signal that corresponds to the data; and
a monitor circuit configured to receive the first signal and to generate a monitor signal that indicates a reliability of the second signal; and
a sense-amplifier controller, including:
a delay circuit configured to enable the at least one sense amplifier to convert the first signal into the second signal a delay time after commencement of a read operation; and
a calibration circuit configured to adjust the delay time in response to the monitor signal.

14. The integrated circuit of claim 13 wherein the delay circuit is configured to enable the at least one sense amplifier to convert the first signal into the second signal a delay time after the generation of a read signal that corresponds to the commencement of the read operation.

15. The integrated circuit of claim 13, further including:
a dummy column of memory cells; and
wherein the at least one sense amplifier includes a dummy sense amplifier that is associated with the dummy column.

16. A system, comprising:
a first integrated circuit including:
at least one memory cell configured to store data; and
a read circuit, including:
at least one sense amplifier, including:
a sense circuit configured to convert a first signal that corresponds to the stored data into a second signal that corresponds to the data; and
a monitor circuit configured to receive the first signal and to generate a monitor signal that indicates a reliability of the second signal; and a sense-amplifier controller, including:
    a delay circuit configured to enable the at least one sense amplifier to convert the first signal into the second signal a delay time after commencement of a read operation; and
    a calibration circuit configured to adjust the delay time in response to the monitor signal; and
    a second integrated circuit coupled to the first integrated circuit.

17. The system of claim 16 wherein at least one of the first and second integrated circuits includes a controller.

18. The system of claim 16 wherein the first and second integrated circuits are disposed on a same die.

19. The system of claim 16 wherein the first and second integrated circuits are disposed on respective dies.

20. A method, comprising:
    converting a first data signal from a memory cell into a second data signal; and
    indicating whether the second data signal is valid based on an analysis of the first data signal.

21. The method of claim 20 wherein the first and second data signals include respective first and second differential data signals.

22. The method of claim 20 wherein indicating whether the second data signal is valid includes indicating that the second data signal is valid if a magnitude of the first data signal is greater than a threshold magnitude.

23. The method of claim 20 wherein indicating whether the second data signal is valid includes indicating that the second data signal is invalid if a magnitude of the first data signal is less than a threshold magnitude.

24. The method of claim 20, further including adjusting a delay between commencement of a read operation and the converting in response to the indicating.

25. The method of claim 24, further including increasing the delay in response to indicating that the second data signal is invalid.

26. The method of claim 24, further including decreasing the delay in response to indicating that the second data signal is valid.

27. The method of claim 24, further including maintaining the delay in response to indicating that the second data signal is valid.

28. The method of claim 24, further including adjusting a parameter of a memory in response to the indicating.

29. A memory block comprising:
    at least one memory cell;
    a sense amplifier configured to carry out a sensing operation on the at least one memory cell and determine whether the sensing operation is valid based on an analysis of the sensing operation.

30. The memory block of claim 29 wherein the sense amplifier is further configured to provide an indication of whether the sensing operation is valid.

31. The memory block of claim 29 wherein an indication of whether a sensing operation is valid is provided to error correction circuitry.

32. The memory block of claim 29 wherein the sensing operation includes sensing a value stored in the at least one memory cell.

33. The memory block of claim 30 wherein the at least one memory cell is part of a column of memory cells.

34. The memory block of claim 33, further including:
    at least one further column of memory cells; and
    at least one further sense amplifier associated with a respective at least one further column of memory cells.

35. The memory block of claim 34 wherein the at least one further sense amplifier is configured to carry out a sensing operation on a memory cell of the associated at least one further column of memory cells and determine whether the sensing operation is valid.

36. The memory block of claim 35 wherein the at least one further sense amplifier is configured to provide an indication of whether the sensing operation is valid.

37. The memory block of claim 34 further including:
    a combination circuit configured to receive the indications from the sense amplifier and the at least one further sense amplifier and determine whether at least one of the respective sensing operations is not valid.

38. The memory block of claim 37 wherein the combination circuit is configured to provide an invalid signal to error correction circuitry in response to the indications from the sense amplifier and the at least one further sense amplifier.

39. The memory block of claim 29, further including error correction circuitry configured to determine a parameter of the memory block in response to an indication that a sensing operation is not valid.

40. The memory block of claim 39 wherein the parameter is at least one of a sense amplifier enable signal delay, a sense amplifier current, a memory block voltage, and a clock frequency.

41. The memory block of claim 29, further including error correction circuitry configured to replace one of: the at least one memory cell; the sense amplifier; and a data path in the memory in response to an indication that a sensing operation is not valid.

42. The memory block of claim 39 wherein the sense amplifier carries out the sensing operation in response to an enable signal and the error detection circuitry is configured to determine a delay in the provision of the enable signal in response to the indication.

43. The memory block of claim 29 wherein the sense amplifier includes:
    sensing circuitry configured to carry out the sensing operation on the at least one memory cell; and
    error detection circuitry configured to determine whether the sensing operation is valid.

44. The memory block of claim 43, wherein the sensing circuitry includes first and second process and hold circuits, each configured to process a difference between a value on a bit line input received at a first node and a value on a compliment bit line input received at a second node and hold the respective first and second nodes at values corresponding to the difference.

45. The memory block of claim 44 wherein the error detection circuitry is configured to compare the value held at one of the first and second nodes of the first process and hold circuit and the value held at the other one of the first and second nodes of the second process and hold circuits.

46. The memory block of claim 45 wherein the first process and hold circuit is biased towards one of the input on the first node and the input on the second node and the second process and hold circuit is biased toward the other one of the input on the second node and the input on the first node.

47. The memory block of claim 46 wherein the error detection circuitry is configured to compare the values held at the respective one of the first and second nodes of the first process and hold circuit and the second process and hold circuit corresponding to the input not biased toward.

48. The memory block of claim 46 wherein for each of the first and second process and hold circuits, the value at one of the first and second nodes corresponding to the biased toward input determines the value held at the other one of the first and second nodes.

49. A method, comprising:
carrying out a sensing operation on at least one memory cell by a sense amplifier; and
determining by the sense amplifier whether the sensing operation is valid.

50. A method of claim 49, further including:
processing a difference between a value on a bit line input received at a first node and a value on a complement bit line input received at a second node and holding the respective first and second nodes at values corresponding to the difference.

51. A sense amplifier, comprising:
sensing circuitry configured to carry out a sensing operation on at least one memory cell; and
error detection circuitry configured to determine whether the sensing operation is valid based on an analysis of the sensing operation.

52. A memory block, comprising:
memory means for storing a value;
sensing means for carrying out a sensing operation on the memory means and for determining whether the sensing operation is valid based on an analysis of the sensing operation.

53. A sense amplifier, comprising:
sensing means for carrying out a sensing operation on at least one memory cell; and
error detection means for determining whether the sensing operation is valid based on an analysis of the sensing operation.

* * * * *